United States Patent
Chen et al.

(10) Patent No.: US 6,812,114 B2
(45) Date of Patent: Nov. 2, 2004

(54) PATTERNED SOI BY FORMATION AND ANNIHILATION OF BURIED OXIDE REGIONS DURING PROCESSING

(75) Inventors: Tze-chiang Chen, Yorktown Heights, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 10/119,931

(22) Filed: Apr. 10, 2002

(65) Prior Publication Data

US 2003/0194847 A1 Oct. 16, 2003

(51) Int. Cl.[7] ............................................. H01L 21/76
(52) U.S. Cl. ...................... 438/423; 438/528; 438/530; 438/795
(58) Field of Search ................................ 438/423, 528, 438/530, 308, 795

(56) References Cited

U.S. PATENT DOCUMENTS

| | | | | |
|---|---|---|---|---|
| 5,278,077 A | * | 1/1994 | Nakato | 438/517 |
| 5,288,650 A | * | 2/1994 | Sandow | 438/766 |
| 5,395,771 A | * | 3/1995 | Nakato | 438/766 |
| 5,468,657 A | * | 11/1995 | Hsu | 438/766 |
| 5,795,813 A | * | 8/1998 | Hughes et al. | 438/423 |
| 5,930,643 A | | 7/1999 | Sadana et al. | |
| 6,071,791 A | * | 6/2000 | Hughes et al. | 438/423 |
| 6,222,253 B1 | * | 4/2001 | Sadana et al. | 257/617 |
| 6,410,938 B1 | * | 6/2002 | Xiang | 257/49 |
| 6,417,078 B1 | * | 7/2002 | Dolan et al. | 438/480 |
| 6,593,205 B1 | * | 7/2003 | Chen et al. | 438/423 |

* cited by examiner

Primary Examiner—John F. Niebling
Assistant Examiner—Angel Roman
(74) Attorney, Agent, or Firm—Scully, Scott Murphy & Presser; Robert M. Trepp, Esq.

(57) ABSTRACT

A method of fabricating a silicon-on-insulator (SOI) substrate including an ultra-thin top Si-containing layer and at least one patterned buried semi-insulating or insulating region having well defined edges is provided. The method includes a step of implanting first ions into a surface of a Si-containing substrate so as to form a first implant region of the first ions in the Si-containing substrate. Following the implantation of first ions, a first annealing step is performed which forms a buried semi-insulating or insulating region within the Si-containing substrate. Next, second ions that are insoluble in the semi-insulating or insulating region are selectively implanted into portions of the buried semi-insulating or insulating region. After the selective implant step, a second annealing step is performed which recrystallizes the buried semi-insulating or insulating region that includes second ions to the same crystal structure as the original Si-containing substrate.

25 Claims, 4 Drawing Sheets

US 6,812,114 B2

PATTERNED SOI BY FORMATION AND ANNIHILATION OF BURIED OXIDE REGIONS DURING PROCESSING

RELATED APPLICATIONS

This application is related to co-assigned and co-pending U.S. application Ser. No. 10/080,804, filed Feb. 21, 2002. The entire content of the aforementioned related application is incorporated herein by reference.

FIELD OF THE INVENTION

The present invention relates to silicon-on-insulator (SOI) substrates for semiconductor integrated circuits (ICs), and more particularly to a method of fabricating an SOI substrate which includes an ultra-thin top Si-containing layer (on the order of about 2000 Å or less) and at least one patterned buried semi-insulating or insulating region such as a buried oxide (BOX) region which has well defined edges that are suitable for sub-micron geometries.

BACKGROUND OF THE INVENTION

Separation by implantation of oxygen (SIMOX) is a technique employed in the semiconductor industry in fabricating SOI substrates that can be used in the manufacturing of ICs. SIMOX typically involves using high-energy ions to implant a large dose of oxygen ions beneath the surface of a bulk Si-containing wafer. Upon high-temperature annealing, the implanted oxygen ions form a continuous BOX region which electrically isolates the Si at the surface (i.e., top or superficial Si layer). Typically, prior art SIMOX processes have been used to fabricate SOIs with a top Si layer and a BOX thickness of several thousand angstroms.

In some applications, it is desirable to form discrete and isolated BOX regions within a Si-containing substrate while not forming BOX regions in other portions of the same Si-containing substrate. Hence, there is a growing need for providing patterned SOI regions. Patterned SOI regions formed within a Si-containing substrate are especially needed for future high performance Si-containing ICs, optical communication devices and three-dimensional device and circuit integration.

Despite this need, there are many challenges in fabricating patterned SOI regions within a Si-containing substrate. For example, the following criteria needs to be met:

(i) maintaining a smooth surface topology between the patterned and unpatterned regions;
(ii) controlling and eliminating crystallographic defects at the edge of the mask used during ion implantation to create patterned regions; and
(iii) controlling and eliminating crystal defects between the nearby buried oxide islands.

In addition to the above criteria, it is necessary for future generation of ICs to provide SOI substrates that have very fine geometries (on the order of a micron or less) associated therewith. In particular, fine geometries are needed in some applications especially in instances wherein the buried oxide region is employed as a diffusion barrier for most dopants in Si. A BOX region under a gate and extension regions of a field effect transistor (FET) also suppresses the infringing field from the drain region during high operating voltages.

In view of the above, there is a continued need for providing a new and improved method of fabricating SOI substrates that have at least one patterned buried semi-insulating or insulating region which has well defined edges that are suitable for sub-micron geometries.

SUMMARY OF THE INVENTION

One object of the present invention is to provide a method of forming at least one patterned buried semi-insulating or insulating region, i.e., at least one discrete and isolated semi-insulating or insulating island, within a Si-containing substrate.

Another object of the present invention is to provide a method of forming at least one patterned buried semi-insulating or insulating region within a Si-containing substrate wherein the at least one patterned buried semi-insulating or insulating region has well defined edges that are suitable for sub-micron geometries. The term "well defined" is used herein to denote a buried semi-insulating or insulating region whose edges are substantially regular shaped and free of crystal defects.

A further object of the present invention is to provide a method of forming at least one patterned buried semi-insulating or insulating region within a Si-containing substrate wherein the method essentially controls and eliminates crystal defects between nearby buried semi-insulating or insulating islands, e.g., between discrete buried oxide (BOX) regions.

A still further object of the present invention is to provide a method of forming an SOI substrate having at least one patterned buried semi-insulating or insulating region which extends the scalability of complementary metal oxide semiconductor (CMOS) devices to less than 0.1 micron channel lengths.

An even further object of the present invention is to provide a method of forming an SOI substrate having an ultra-thin top Si-containing layer. The term "ultra-thin" as used in conjunction with the top Si-containing layer of the SOI substrate denotes a layer having a thickness of about 2000 Å or less, with a thickness of from about 100 to about 500 Å being more highly preferred.

An additional object of the present invention is to provide a method of forming an SOI substrate which includes an ultra-thin top Si-containing layer as well as a thin patterned buried semi-insulating or insulating region which has a thickness of about 4000 Å or less, with a thickness of from about 10 to about 1500 Å being more highly preferred.

These and other objects and advantages are achieved in the present invention by utilizing a method wherein the ultra-thin top Si-containing layer and the at least one patterned buried semi-insulating or insulating region are formed utilizing various ion implantation steps which include at least one ion implantation step that selectively annihilates portions of a previously formed buried semi-insulating or insulating region.

In accordance with the present invention, the ion implantation step that selectively annihilates portions of a previously formed buried semi-insulating or insulating region comprises the use of ions that are non-soluble in the previously formed buried semi-insulating or insulating region. The non-soluble ions function to create heavily damaged or amorphous regions within selective portions of the previously formed buried semi-insulating or insulating region. Upon annealing, a buried oxide region forms in implanted regions that do not include the non-soluble ions, whereas recrystallization occurs in implanted regions which include the non-soluble ions.

In broad terms the inventive method comprises the steps of:

implanting first ions into a surface of a Si-containing substrate so as to form a first implant region of said first ions in said Si-containing substrate;

first annealing said Si-containing substrate containing said first implant region so as to convert said first implant region into a buried semi-insulating or insulating region;

selectively implanting second ions into at least portions of said buried semi-insulating or insulating region, said second ions are insoluble in said buried semi-insulating or insulating region; and second annealing said Si-containing substrate so as to recrystallize said buried semi-insulating or insulating region that includes said second ions.

In one embodiment, the method of the present invention comprises the steps of:

implanting first ions into a surface of a Si-containing substrate so as to form a first implant region of said first ions in said Si-containing substrate;

first annealing said Si-containing substrate containing said first implant region so as to convert said first implant region into a buried semi-insulating or insulating region;

forming a patterned mask on said surface of said Si-containing substrate;

implanting second ions into at least portions of said buried semi-insulating or insulating region not protected by said patterned mask, said second ions are insoluble in said buried semi-insulating or insulating region;

removing said patterned mask; and second annealing said Si-containing substrate so as to recrystallize said buried semi-insulating or insulating region that includes said second ions.

In another embodiment, the method of the present invention comprises the steps of:

implanting first ions into a surface of a Si-containing substrate so as to form a first implant region of said first ions in said Si-containing substrate;

first annealing said Si-containing substrate containing said first implant region so as to convert said first implant region into a buried semi-insulating or insulating region;

forming a patterned mask on said surface of said Si-containing substrate;

implanting second ions into at least portions of said buried semi-insulating or insulating region not protected by said patterned mask, said second ions are insoluble in said buried semi-insulating or insulating region;

second annealing said Si-containing substrate so as to recrystallize said buried semi-insulating or insulating region that includes said second ions; and removing said patterned mask.

DETAILED DESCRIPTION OF THE INVENTION

Figure 1A:
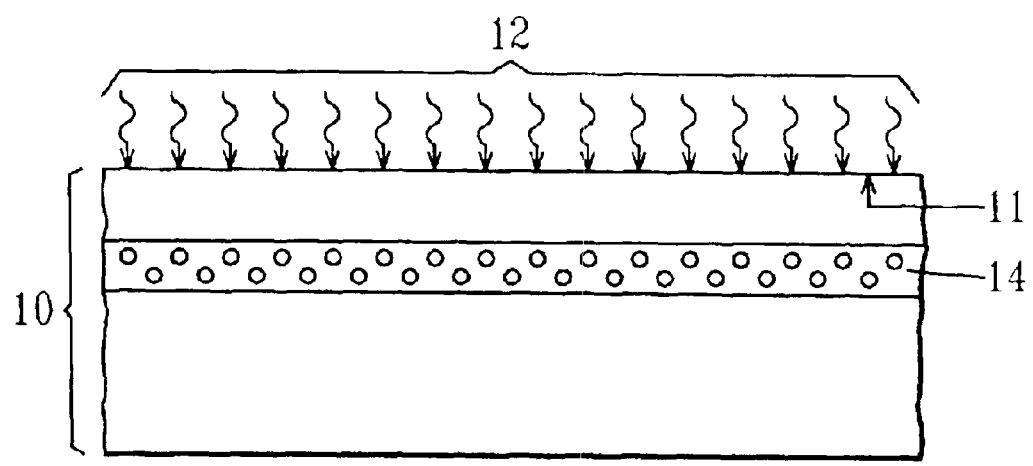
FIGS. 1A–1F are pictorial representations (through cross-sectional views) showing the various processing steps employed in one embodiment of the present invention which is used in forming an SOI substrate having at least one patterned buried semi-insulating or insulating region that has well defined edges associated therewith.

The present invention, which provides a method of fabricating an SOI substrate having an ultra-thin top Si-containing layer and at least one patterned buried semi-insulating or insulating region, will now be described in greater detail by referring to the drawings that accompany the present application.

Reference is first made to FIGS. 1A–1F which show the various processing steps that are employed in one embodiment of the present invention wherein an SOI substrate having an ultra-thin top Si-containing layer and at least one patterned buried semi-insulating or insulating region that has well defined edges is fabricated. Specifically, FIG. 1A illustrates the first processing step of the present invention wherein first ions 12 are implanted into a surface of Si-containing substrate 10 under conditions wherein an implant region of first ions (labeled as 14) is formed within the Si-containing substrate. The first ions may be implanted using a continuous or pulse ion implantation process wherein various doses of first ions 12 can be employed.

The term "Si-containing substrate" as used herein denotes any Si-containing material including, but not limited to: Si, SiGe, SiC, SiCGe, nitrogen doped Si, Si/Si and Si/SiGe. A preferred Si-containing substrate employed in the present invention is a Si wafer. The Si-containing substrate may be undoped or doped (n or p-type) depending on the future use of the SOI wafer.

The first implant step of the present invention wherein first ions 12 are implanted is performed using an ion dosage of from 3E15 to about 5E17 $cm^{-2}$, with an ion dosage of from about 1E16 to about 1E17 $cm^{-2}$ being more preferred. In addition to using the above range of ion doses, first ions 12 are implanted using an ion implantation apparatus that operates at a beam current density of from about 0.05 to about 500 milliamps $cm^{-2}$ and at an energy of from about 10 to about 1000 keV. More preferably, this implant is carried out at a beam current density of from about 0.5 to about 50 milliamps $cm^{-2}$ (i.e., mA $cm^{-2}$) using an energy of from about 30 to about 250 keV.

This implant, which may be referred to as a base ion implant, is carried out at a temperature of from about 100° to about 800° C., with a temperature of from about 200° to about 600° C. being more highly preferred.

If desired, the base implant step may be followed by a second implant of said first ions that is carried out using an ion dose of from about 1E13 to about 1E17 $cm^{-2}$, with an ion dose of from about 1E14 to about 1E17 $cm^{-2}$ being more highly preferred. The second ion implant of first ions is carried out at an energy of from about 10 to about 1000 keV, with an energy of from about 30 to about 500 keV being more preferred.

This second implant of said first ions is performed at a temperature of from about 4K to about 400° C. and a beam current density of from about 0.05 to about 500 mA $cm^{-2}$. More preferably, the second implant of said first ions may be performed at a temperature of from about −20° to about 200° C. and with a beam current density of from about 0.05 to about 20 mA $cm^{-2}$.

Suitable first ions that are employed in the present invention include any ions that are soluble in silicon and which are capable of forming a buried semi-insulating or insulating region upon subjecting the same to a first high-temperature annealing step (on the order of about 1000° C. or above). Illustrative examples of such first ions include, but are not limited to: oxygen, nitrogen and any combination including mixtures thereof. Of the various first ions mentioned above, it is highly preferred in the present invention to use oxygen as the first ions.

When oxygen is employed as the first ions, it is highly preferred that the oxygen ions (first ions 12) be implanted using the following conditions:

(I) First dose of oxygen: Oxygen dosage of from about 3E15 to about 5E17 $cm^{-2}$; implant energy of from about 10 to about 400 keV; and temperature of about 23° C. to about 700° C.;

(II) Second dose of oxygen: Oxygen dosage of from about 1E14 to about 1E16 $cm^{-2}$; implant energy of from about 10 to about 400 keV; and temperature of about 4K to about 473K;

Notwithstanding the type of first ions employed, the first ions are implanted to an average depth that is from about 15 to about 1000 nm, more preferably from about 100 to about 600 nm, below the uppermost surface (labeled as 11 in the drawings) of the Si-containing substrate.

Figure 1B:
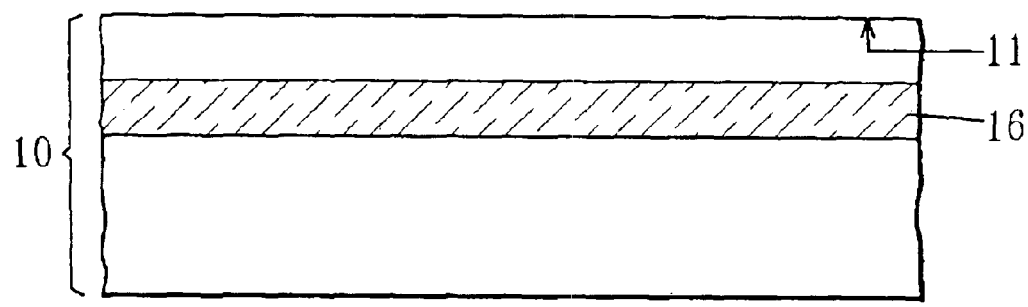

Next, and as shown in FIG. 1B, the structure illustrated in FIG. 1A is subjected to a first high-temperature annealing step which is capable of converting first implant region 14 into continuous, buried semi-insulating or insulating region 16. Specifically, continuous, buried semi-insulating or insulating region 16 is formed by annealing (this annealing step is referred to hereinafter as the first annealing step) the structure shown in FIG. 1A at a temperature of about 1000° C. or above and in an oxidizing ambient. More specifically, the high-temperature first annealing step of the present invention is carried out at a temperature of from about 1300° to about 1350° C.

The time period in which the first annealing step is preformed may vary, but typically it is from about 1 to about 100 hours, with an annealing time period of from about 2 to about 24 hours being more highly preferred.

In accordance with the present invention, the first annealing step is carried out in an oxidizing ambient that includes at least one oxygen-containing gas such as $O_2$, NO, $N_2O$, air, ozone or mixtures thereof. The oxidizing ambient may further include at least one inert gas such as He, Ar, $N_2$, Kr, Xe and Ne. More specifically, the oxidizing ambient employed in the first annealing step of the present invention comprises from about 0.1 to about 100% oxygen-containing gas and from about 99.9 to about 0% inert gas such as He, Ar, and $N_2$. In one preferred embodiment of the present invention, Ar is employed as the inert gas in the first annealing step.

The first annealing step may be carried out by simply heating the substrate at a specific temperature ramp rate to the targeted temperature, or various ramp and soak cycles may be employed. During the various ramp and soak cycles it is possible to vary the content of the annealing ambient within the ranges mentioned above. The parameters for the ramp and soak cycles are mentioned in U.S. Pat. No. 5,930,643 to Sadana, et al., the entire content of which is incorporated herein by reference. Note that the parameters for the ramp and soak cycles in the '643 patent may be adjusted herein to achieve formation of the inventive SOI substrate. For example, a ramp rate (heating and cooling) of from about 0.1° C./min to about 10° C./min may be employed.

Figure 1C:
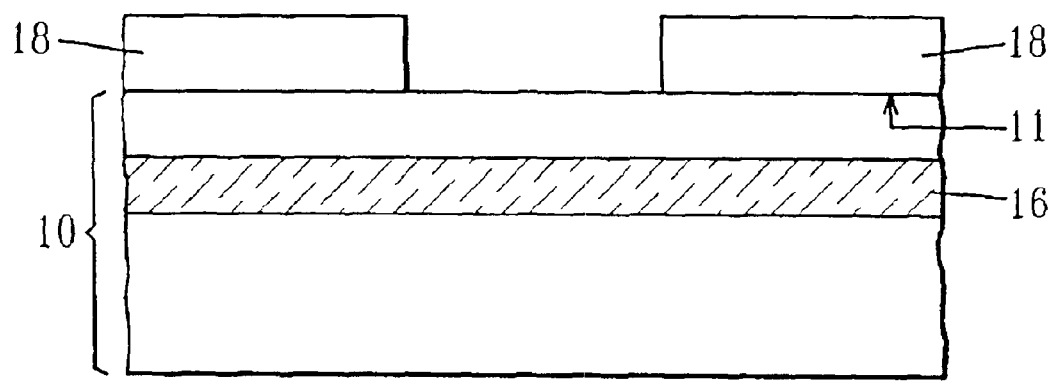

Next, and as shown in FIG. 1C, patterned mask 18 is formed on uppermost surface 11 of Si-containing substrate 10. Patterned mask 18, which serves to protect a portion of the Si-containing substrate, while leaving other portions of the Si-containing substrate unprotected, i.e., exposed, is formed using conventional processes well known in the art. For example, the patterned mask is formed by first providing a layer of mask material, such as a dielectric material, a hardmask, or a polymer (including commercially available photoresists), on the entire surface of the Si-containing substrate. The layer of mask material is formed by a conventional deposition process such as chemical vapor deposition (CVD), plasma-assisted CVD, evaporation, sputtering, spin-on coating, chemical solution deposition, or atomic layer deposition. Alternatively, the layer of mask material may be formed by a thermal growing process.

After forming the layer of mask material on the Si-containing substrate, the resultant structure is then subjected to a conventional lithography step which may include the steps of applying a photoresist to the mask material (this step may be omitted if the mask material is a photoresist), exposing the photoresist to a pattern of radiation, and developing the pattern in the photoresist using a resist developer. In cases wherein the mask material is other than a photoresist, the pattern is then transferred to the mask material by utilizing a conventional dry etching process such as reactive-ion etching, ion beam etching, plasma etching or laser ablation and the photoresist that is formed atop the layer of mask material is removed using a conventional stripping process well known to those skilled in the art.

Figure 1D:
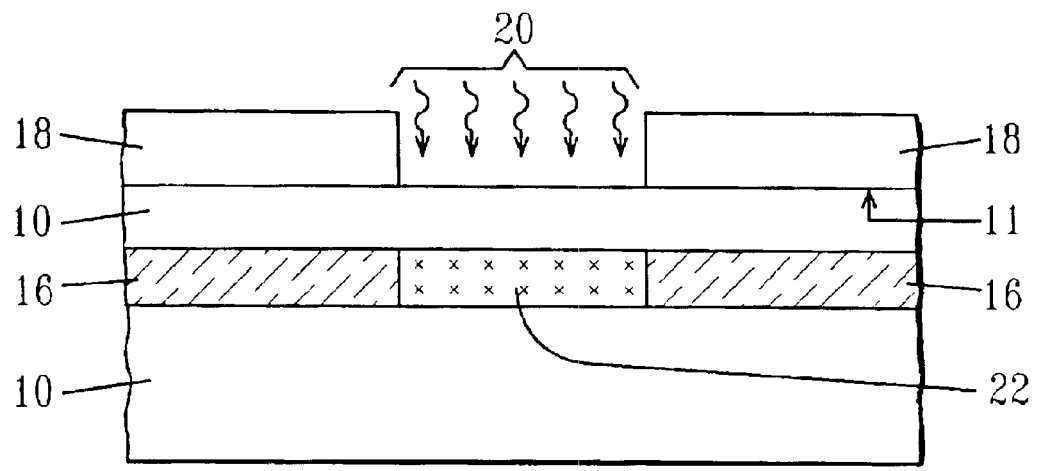

Following the formation of patterned mask 18, second ions 20 that are non-soluble in buried semi-insulating or insulating region 16 are implanted into the Si-containing substrate not containing said patterned mask, See FIG. 1D. Note that the implanted second ions form damaged or amorphized region 22 with portions of buried semi-insulating or insulating region 16. Specifically, the second ions are employed in the present invention to selectively annihilate portions of the buried semi-insulating or insulating region previously formed.

Suitable second ions which can be employed in the present invention include, but are not limited to: Ge, As, C, N, Sn, S, Ar, Ne, Kr, Xe, Rn, Mo, W, Ta, In, Ag, Au and any combination thereof including alloys. Of the various second ions mentioned above, it is preferred to use Ge or As ions.

The second ions are implanted using a continuous or pulse ion implantation mode. Specifically, the second ions are implanted using an ion dosage of from 1E13 to about 1E17 $cm^{-2}$, with an ion dosage of from about 1E14 to about 1E17 $cm^{-2}$ being more preferred. In addition to using the above range of ion doses, second ions 20 are implanted using an ion implantation apparatus that operates at a beam current density of from about 0.01 to about 50 mA $cm^{-2}$ and at an energy of from about 1 to about 1000 keV. More preferably, this implant is carried out at a beam current density of from about 0.05 to about 20 mA $cm^{-2}$ and at an energy of from about 10 to about 500 keV.

The second ion implantation step is carried out at a temperature of from about 4K to about 800° C. More preferably, the second ion implant may be carried out at a temperature of from about −20° to about 200° C.

Figure 1E:
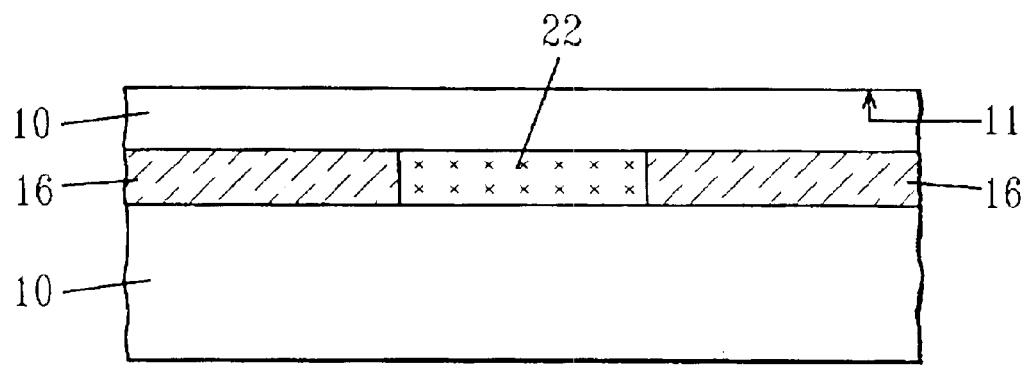

Next, patterned mask 18 may be removed providing the structure shown in FIG. 1E. Specifically, the patterned mask is removed at this point of the present invention utilizing a conventional etching process which is highly selective in removing patterned mask 18 as compared with Si-containing substrate 10. Note that in some embodiments of the present invention, as to be discussed in further detail hereinbelow, the patterned mask remains on the surface of the Si-containing substrate during the second annealing step.

Following the removal of the patterned mask, the structure shown in FIG. 1E is then subjected to a second annealing step which recrystallizes regions containing the implanted second ions into a crystalline region which substantially matches that of the Si-containing substrate.

Note that the present invention contemplates using the same or different annealing conditions for both the first annealing step and the second annealing step. Specifically, the second annealing step is a high-temperature annealing step which is carried out at a temperature of about 1000° C. or above and in either an oxidizing ambient or an inert ambient. More specifically, the high-temperature second annealing is carried out at a temperature of from about 1300° to about 1350° C.

The time period in which the second annealing is preformed may vary, but typically it is from about 1 to about 100 hours, with Wan annealing time period of from about 2 to about 24 hours being more highly preferred. In accordance with the present invention, the second annealing is carried out in either an oxidizing ambient or an inert ambient. The oxidizing ambient includes at least one oxygen-containing gas such as $O_2$, NO, $N_2O$, air, ozone or mixtures thereof. The inert gas such as He, Ar, $N_2$, Kr, Xe and Ne. In some embodiments, the second annealing ambient includes a combination of an oxidizing ambient and an inert gas. More specifically, the oxidizing ambient employed in the second annealing step of the present invention may comprise from about 0.1 to about 100% oxygen-containing gas and from about 99.9 to about 0% inert gas such as He, Ar, and $N_2$. In one preferred embodiment of the present invention, Ar is employed as the inert gas in the second annealing step. More preferably, the second annealing step employed in the present invention is carried out in an ambient that includes from about 0.1 to about 50% oxygen-containing gas and from about 50 to about 99.9% inert gas. When the annealing ambient does not contain any oxygen, gases such as He, Ar, $N_2$, Kr, Xe and Ne either in pure form or in mixture form may be employed.

The second annealing step may be carried out by simply heating the substrate at a specific temperature ramp rate to the targeted temperature, or various ramp and soak cycles may be employed. During the various ramp and soak cycles it is possible to vary the content of the annealing ambient within the ranges mentioned above. The parameters for the ramp and soak cycles are mentioned in U.S. Pat. No. 5,930,643 to Sadana, et al, the entire content of which is incorporated herein by reference. Note that the parameters for the ramp and soak cycles in the '643 patent may be adjusted herein to achieve formation of the inventive SOI substrate. For example, a ramp rate (heating and cooling) of from about 0.1° C./min to about 10° C./min may be employed.

Figure 1F:
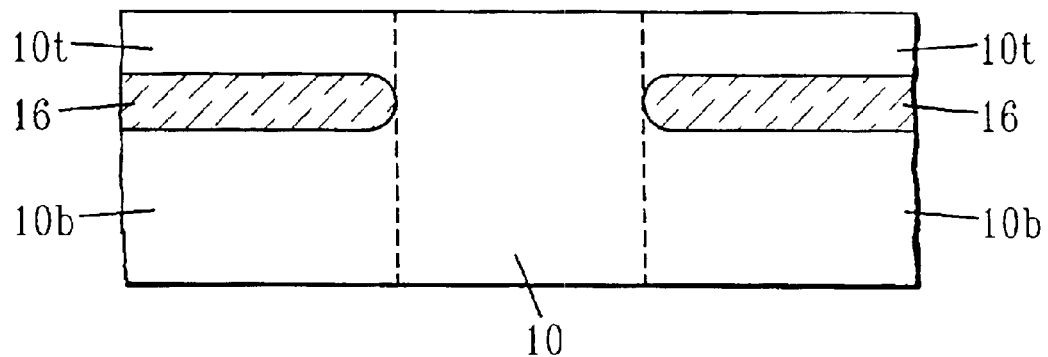

The structure that is formed after annealing is shown in FIG. 1F. Note that the remaining semi-insulating or insulating 16 electrically isolates top superficial Si-containing layer 10t from bottom Si-containing layer 10b. The dotted lines are employed to represent the boundaries of these two Si-containing layers. It should be also noted that during the various annealing steps a surface oxide forms on the surface of the Si-containing substrate. The surface oxide is not shown in these drawings since it is typically removed after annealing using a chemical wet etch process that has a high selectivity for removing oxide as compared with Si.

The top Si-containing layer formed using the inventive process is an ultra-thin Si-containing layer. That is, the resulting top Si-containing layer of the SOI substrate of the present invention has a thickness of about 2000 Å or less, with a thickness of from about 100 to about 500 Å being more highly preferred. The thickness of the bottom Si-containing layer is inconsequential to the present invention.

Figure 2A:
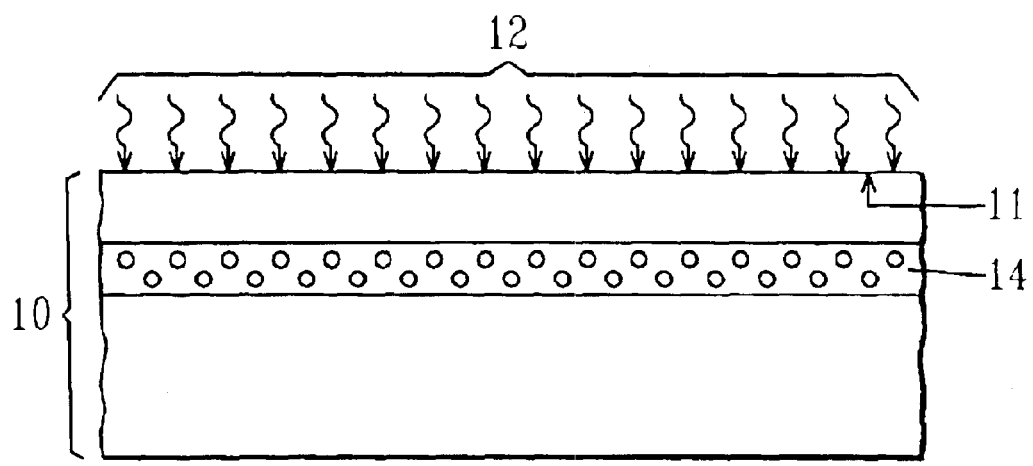
FIGS. 2A–2F are pictorial representations (through cross-sectional views) showing the various processing steps employed in another embodiment of the present invention which is used in forming an SOI substrate having at least one patterned buried semi-insulating or insulating region that has well defined edges associated therewith.
Figure 2B:
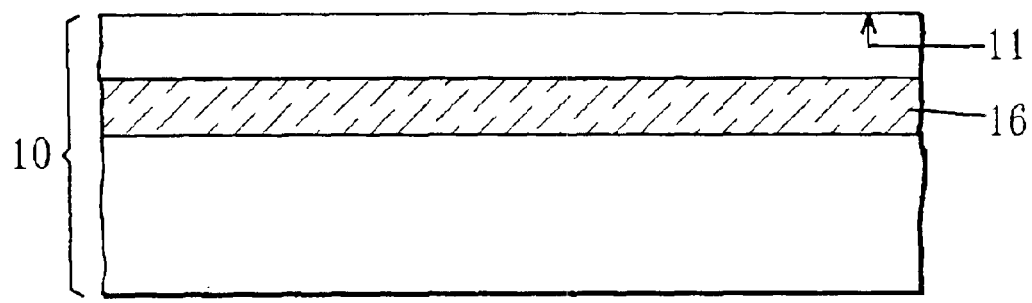
Figure 2C:
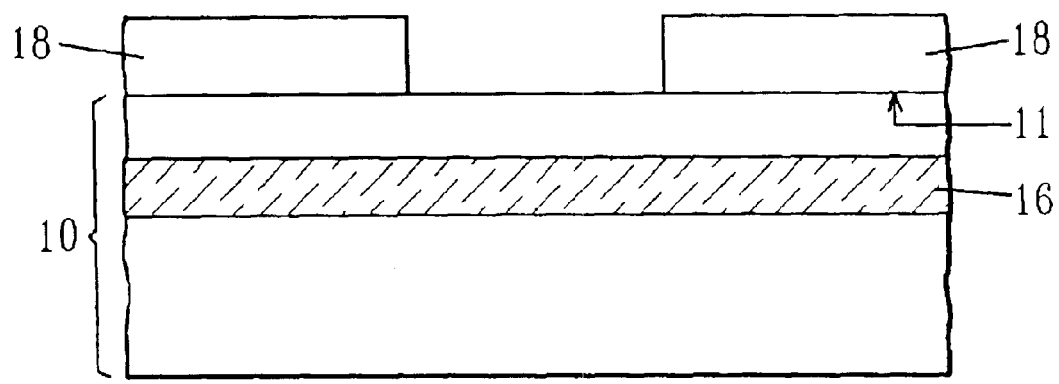
Figure 2D:
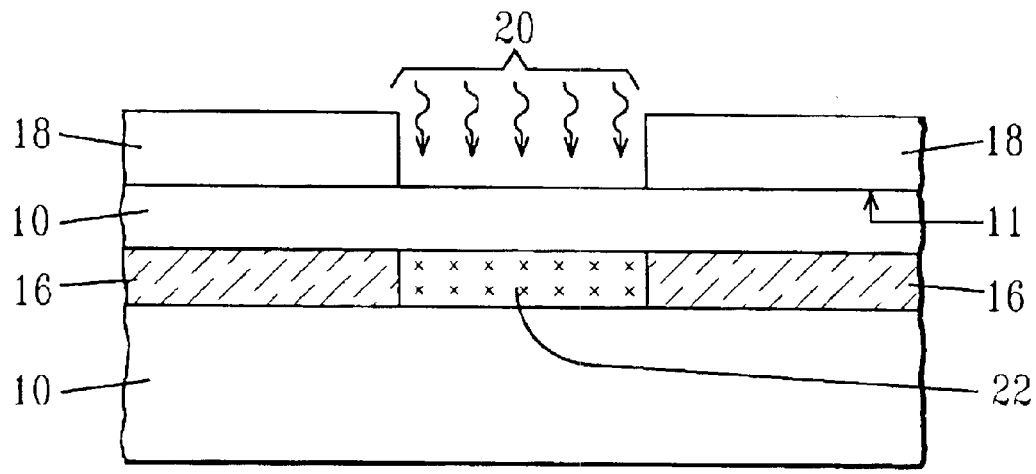
Figure 2E:
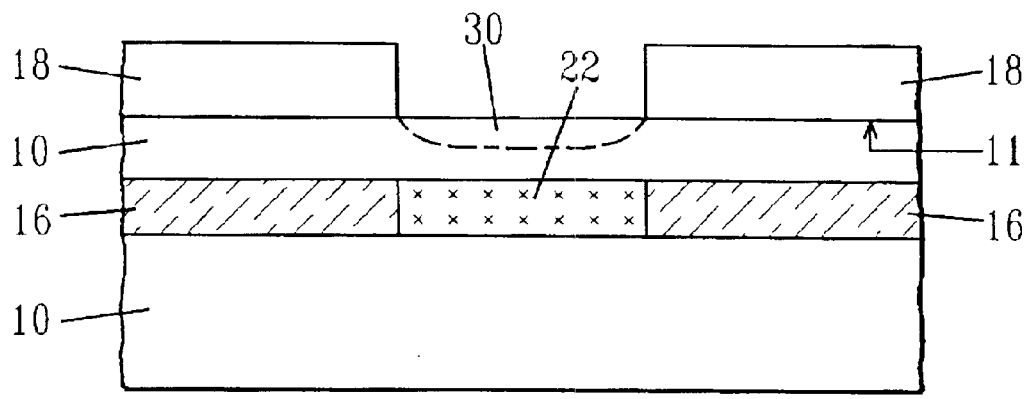
Figure 2F:
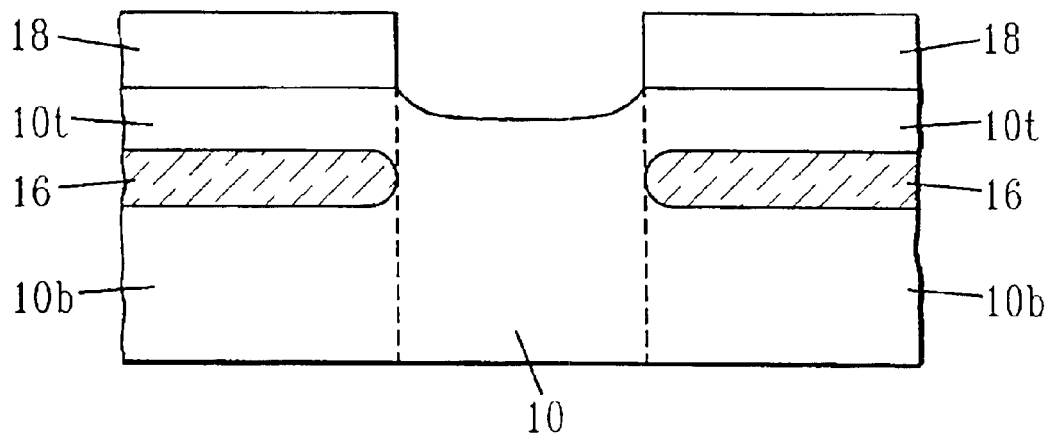

Reference is now made to FIGS. 2A–2F which show another embodiment of the present invention wherein patterned mask 18 remains on the surface of the structure during the second annealing step. Since FIGS. 2A–2D are the same as shown in FIGS. 1A–1D no further explanation of those figures is deemed necessary herein. Unlike the previous embodiment wherein the patterned mask was removed from the structure prior to the second annealing, in this embodiment the patterned mask remains on the structure during the second annealing step. The resultant structure after annealing in an oxidizing ambient is shown in FIG. 2E. Note that surface areas (labeled as 30) between the patterned mask have been oxidized hence consuming the top surface of the Si-containing substrate. FIG. 2F shows the structure after removal of oxidized surface regions 30. In the case where annealing is performed in inert ambient, the surface be smooth without any noticeable dip. Following removal of the oxidized surface region, the patterned mask may be removed from the structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a silicon-on-insulator (SOI) substrate comprising an ultra-thin top Si-containing layer and at least one patterned buried semi-insulating or insulating region having well defined edges, said method comprising the steps of:

implanting first ions into a surface of a Si-containing substrate so as to form a first implant region of said first ions in said Si-containing substrate;

first annealing said Si-containing substrate containing said first implant region so as to convert said first implant region into a buried semi-insulating or insulating region;

selectively implanting second ions into at least portions of said buried semi-insulating or insulating region, said second ions are insoluble in said buried semi-insulating or insulating region; and second annealing said Si-containing substrate so as to recrystallize said buried semi-insulating or insulating region that includes said second ions.

2. The method of claim 1 wherein said first ions are selected from the group consisting of oxygen, nitrogen and any combination or mixtures.

3. The method of claim 2 wherein said first ions are oxygen ions.

4. The method of claim 1 wherein said first ions are implanted using an ion dosage of from about 3E15 to about 5E17 $cm^{-2}$.

5. The method of claim 1 wherein said first ions are implanted at an energy of from about 10 to about 1000 keV.

6. The method of claim 1 wherein said first ions are implanted at a temperature of from about 100° to about 800° C. and at a beam current density of from about 0.05 to about 500 mA $cm^{-2}$.

7. The method of claim 1 wherein said first ions are implanted using a continuous or pulse ion implantation mode.

8. The method of claim 1 wherein said implanting of said first ions step comprises a base ion implant followed by an additional ion implant.

9. The method of claim 8 wherein said additional ion implant is performed at an ion dosage of from about 1E13 to about 1E17 $cm^{-2}$.

10. The method of claim 8 wherein said additional ion implant is carried out an energy of from about 10 to about 1000 keV.

11. The method of claim 8 wherein said additional ion implant is performed at a temperature of from about 4K to about 400° C. and at a beam current density of from about 0.05 to about 500 mA cm$^{-2}$.

12. The method of claim 1 wherein said first ions are oxygen ions and said implant is carried out by a first oxygen implant step which is performed at an oxygen dosage of from about 3E15 to about 5E17 cm$^{-2}$; implant energy of from about 10 to about 400 keV, and a temperature of about 23° C. to about 700° C.; and an additional oxygen ion implant step which is carried out at an oxygen dosage of from about 1E14 to about 1E16 cm$^{-2}$, implant energy of from about 10 to about 400 keV, and a temperature of about 4K to about 473K.

13. The method of claim 1 wherein said selective implanting comprising the use of a patterned mask formed atop said Si-containing substrate.

14. The method of claim 1 wherein said second ions are selected from the group consisting of Ge, As, C, N, Sn, S, Ar, Ne, Kr, Xe, Rn, Mo, W, Ta, In, Ag, Au and any combination or alloy thereof.

15. The method of claim 14 wherein said second ions are Ge or As ions.

16. The method of claim 1 wherein said second ions are implanted using an ion dosage of from about 1E13 to about 1E17 cm$^{-2}$.

17. The method of claim 1 wherein said second ions are implanted at an energy of from about 1 to about 1000 keV.

18. The method of claim 1 wherein said second ions are implanted at a temperature of from about 4K to about 800° C. and at a beam current density of from about 0.05 to about 500 mA cm$^{-2}$.

19. The method of claim 1 wherein said first and second annealings are performed using the same or different annealing conditions.

20. The method of claim 19 wherein said first and second annealings are performed at a temperature of about 1000° C. or higher and in an oxidizing ambient.

21. The method of claim 20 wherein said oxidizing ambient comprises at least one oxygen-containing gas which is optionally admixed with an inert gas.

22. The method of claim 21 wherein said oxidizing ambient comprises from about 0.1 to about 99.9% oxygen-containing gas and from about 99.9 to about 0% inert gas.

23. The method of claim 1 wherein said second annealing is performed in either an oxidizing ambient or an inert gas ambient; or a combination thereof.

24. A method of fabricating a silicon-on-insulator (SOI) substrate comprising an ultra-thin top Si-containing layer and at least one patterned buried semi-insulating or insulating region having well defined edges, said method comprising the steps of:

implanting first ions into a surface of a Si-containing substrate so as to form a first implant region of said first ions in said Si-containing substrate;

first annealing said Si-containing substrate containing said first implant region so as to convert said first implant region into a buried semi-insulating or insulating region;

forming a patterned mask on said surface of said Si-containing substrate;

implanting second ions into at least portions of said buried semi-insulating or insulating region not protected by said patterned mask, said second ions are insoluble in said buried semi-insulating or insulating region;

removing said patterned mask; and second annealing said Si-containing substrate so as to recrystallize said buried semi-insulating or insulating region that includes said second ions.

25. A method of fabricating a silicon-on-insulator (SOI) substrate comprising an ultra-thin top Si-containing layer and at least one patterned buried semi-insulating or insulating region having well defined edges, said method comprising the steps of:

implanting first ions into a surface of a Si-containing substrate so as to form a first implant region of said first ions in said Si-containing substrate;

first annealing said Si-containing substrate containing said first implant region so as to convert said first implant region into a buried semi-insulating or insulating region;

forming a patterned mask on said surface of said Si-containing substrate;

implanting second ions into at least portions of said buried semi-insulating or insulating region not protected by said patterned mask, said second ions are insoluble in said buried semi-insulating or insulating region;

second annealing said Si-containing substrate so as to recrystallize said buried semi-insulating or insulating region that includes said second ions; and removing said patterned mask.

* * * * *

UNITED STATES PATENT AND TRADEMARK OFFICE
CERTIFICATE OF CORRECTION

PATENT NO. : 6,812,114 B2
DATED : November 2, 2004
INVENTOR(S) : Tze-Chiang Chen et al.

It is certified that error appears in the above-identified patent and that said Letters Patent is hereby corrected as shown below:

Column 7,
Line 8, "wan" should read -- an --

Signed and Sealed this

Twenty-fourth Day of May, 2005

JON W. DUDAS
*Director of the United States Patent and Trademark Office*